US009673773B2

(12) United States Patent
Liu et al.

(10) Patent No.: US 9,673,773 B2
(45) Date of Patent: Jun. 6, 2017

(54) SIGNAL INTERCONNECT WITH HIGH PASS FILTER

(71) Applicant: QUALCOMM Incorporated, San Diego, CA (US)

(72) Inventors: Chunchen Liu, San Diego, CA (US); Po-Hung Chen, San Diego, CA (US); Zhengyu Duan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 73 days.

(21) Appl. No.: 14/747,985

(22) Filed: Jun. 23, 2015

(65) Prior Publication Data
US 2016/0380607 A1    Dec. 29, 2016

(51) Int. Cl.
| H03H 7/01 | (2006.01) |
| H03H 7/07 | (2006.01) |
| H03H 7/38 | (2006.01) |
| H03H 7/00 | (2006.01) |
| H03H 7/06 | (2006.01) |
| H01P 1/24 | (2006.01) |
| H03K 19/00 | (2006.01) |
| H04B 3/14 | (2006.01) |
| H04L 25/03 | (2006.01) |

(52) U.S. Cl.
CPC .......... *H03H 7/0138* (2013.01); *H03H 7/004* (2013.01); *H03H 7/0123* (2013.01); *H03H 7/06* (2013.01); *H03H 7/07* (2013.01); *H03H 7/383* (2013.01); *H01P 1/24* (2013.01); *H03K 19/0005* (2013.01); *H04B 3/14* (2013.01); *H04L 25/03878* (2013.01)

(58) Field of Classification Search
CPC ........ H03H 7/0123; H03H 7/06; H03H 7/065; H03H 7/07; H03H 7/075; H03H 7/38; H03H 7/383; H03H 7/0138; H03H 7/004; H01P 1/24; H03K 19/084; H03K 19/0005; H04B 3/14; H04L 25/03878
USPC ........ 333/32, 172, 22 R, 260; 326/22, 26, 3, 326/82, 86, 890
See application file for complete search history.

(56) References Cited

U.S. PATENT DOCUMENTS

| 5,172,051 A | * | 12/1992 | Zamborelli | ........ G01R 1/06772 |
| | | | | 324/149 |
| 7,190,188 B2 | | 3/2007 | Otsuka et al. | |
| 7,256,575 B2 | | 8/2007 | Pollock et al. | |
| (Continued) | | | | |

FOREIGN PATENT DOCUMENTS

| DE | 2353058 A1 | 4/1975 |
| EP | 0872961 A1 | 10/1998 |

OTHER PUBLICATIONS

International Search Report and Written Opinion—PCT/US2016/034882—ISA/EPO—Sep. 13, 2016.

*Primary Examiner* — Benny Lee
*Assistant Examiner* — Jorge Salazar, Jr.
(74) *Attorney, Agent, or Firm* — Loza & Loza, LLP

(57) ABSTRACT

A signal interconnect includes a transmission line, a termination circuit coupled to the transmission line, and a high pass filter circuit coupled in series along the transmission line. The high pass filter circuit includes a first resistive circuit and a first capacitive circuit coupled in parallel. The first resistive circuit has a resistance based on a difference between a resistance of the transmission line at a high frequency and a resistance of the transmission line at a low frequency.

17 Claims, 10 Drawing Sheets

(56) References Cited

U.S. PATENT DOCUMENTS

| | | |
|---|---|---|
| 7,430,291 B2 | 9/2008 | Washburn et al. |
| 7,586,987 B2 | 9/2009 | Vorenkamp et al. |
| 7,957,412 B2 | 6/2011 | Steinberger et al. |
| 8,213,894 B2 | 7/2012 | O'Mahony et al. |
| 2003/0043900 A1 | 3/2003 | Deas et al. |

\* cited by examiner

SIGNAL INTERCONNECT WITH HIGH PASS FILTER

BACKGROUND

Field of the Disclosure

Aspects of the disclosure relate generally to electrical circuits, and more specifically, but not exclusively, to a signal interconnect that includes a high pass filter.

Description of Related Art

With the advancement of very large scale integration (VLSI) technology, inter-chip communication is expected to exceed 20 GHz. The design of an inter-chip interconnect that operates at high signaling rates may compensate for high losses, latency, and parasitic effects that occur at these signaling rates. In addition, it is desirable to keep power consumption low even at these high signaling rates.

Some high speed transmission line designs use active pre-emphasis and equalization circuits at the drivers and the receivers. However, active circuits consume a significant amount of power.

Passive compensation is one potential approach to achieve the goal of high speed and low power. With a passive approach (e.g., using passive and linear elements), active components conventionally used in a transmission line design are eliminated. Thus, the compensation circuitry will consume much less power. In one passive compensation technique, a resistive terminator is used to maximize the height of the eye-pattern of the signal at the receiver. In another passive compensation technique, a discrete set of shunt conductance is employed to match the distortionless condition of the Heaviside function. In another passive compensation technique, a serial resistor replaces the resistive terminator for scenarios where the delay time of the transmission line is shorter than the half bit period. Hence, this latter technique is limited by the length of the wire and the wave length of the signal.

In general, inter-chip parasitic effects make these schemes difficult to implement. Digital signals have wide band frequency components. Consequently, it is desirable for an interconnect to tolerate a wide band working frequency. In view of the above, there is a need for a passive compensation scheme that can reduce jitter effectively and still have a good receive signal eye-pattern at very high frequencies.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

The disclosure relates in some aspects to passive compensation for very high frequency deployments (e.g., up to and exceeding 50 GHz). In some aspects, the passive compensation scheme can reduce jitter effectively and have an acceptable receive signal eye-pattern at very high frequencies.

In one aspect, the disclosure provides a signal interconnect including: a transmission line: a termination circuit coupled to the transmission line; and a high pass filter circuit coupled in series along the transmission line, wherein the high pass filter circuit includes a first resistive circuit and a first capacitive circuit coupled in parallel, and the first resistive circuit has a resistance based on a difference between a resistance of the transmission line at a high frequency and a resistance of the transmission line at a low frequency.

Examples of additional aspects of the disclosure follow. In some aspects, the first capacitive circuit has a capacitance selected based on a desired transfer function value, an operating frequency, a characteristic impedance of the transmission line, and the resistance of the first resistive circuit. In some aspects, the desired transfer function value is substantially equal to 0.5. In some implementations, the term "substantially equal to" means "within 10%." In some aspects, the resistance of the first resistive circuit is equal to $Rw(f=1/T)-Rw(f \to 0)$, where $Rw(f)$ is wire resistance as a function of a frequency f, and T is a time period of a bit carried by the transmission line. In some aspects, the capacitance of the first capacitive circuit is based on $T(s)=Zt/(Zd+Zt)$, where $Zd=1/(1/Rd+sCd)$, and where $T(s)$ is a transfer function, Zt is an impedance of the termination circuit, Zd is an impedance of the high pass filter circuit, Rd is the resistance of the first resistive circuit, s is a function of a frequency of a signal, and Cd is the capacitance of the first capacitive circuit. In some aspects, an impedance of the termination circuit is substantially equal to a characteristic impedance of the transmission line.

In some aspects, the signal interconnect further includes a signal source, wherein the high pass filter circuit is located between the signal source and the transmission line. In some aspects, the transmission line includes the high pass filter circuit. In some aspects, the transmission line includes a differential pair of conductors.

In some aspects, the high pass filter circuit further includes a second resistive circuit in parallel with the first resistive circuit and the first capacitive circuit. In some aspects, the second resistive circuit includes a third resistive circuit in series with a fourth resistive circuit; the third resistive circuit is coupled to the fourth resistive circuit at a connection point; and the signal interconnect further includes another high pass filter circuit coupled between the connection point and a ground terminal. In some aspects, the other high pass filter circuit includes an inductive circuit in series with a fifth resistive circuit.

In some aspects, the termination circuit includes a second resistive circuit. In some aspects, the termination circuit includes an inductive circuit in series with a second resistive circuit.

In some aspects, a capacitance of the first capacitive circuit is selected to maximize a quality of an eye diagram (eye-pattern) associated with a signal carried by the signal interconnect. In some aspects, a capacitance of the first capacitive circuit is selected to minimize jitter associated with a signal carried by the signal interconnect. In some aspects, a capacitance of the first capacitive circuit is selected to compensate for a low pass effect of the transmission line.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

The application relates in some aspects to a low-power and high-speed interconnect technique for inter-chip communication (e.g., signaling between integrated circuits (ICs)) or other communication. In some aspects, such an interconnect can be used instead of conventional active pre-emphasis and equalization circuits. The interconnect includes a high pass filter at a signal source (e.g., a signal driver) or within a transmission line. In some aspects, the high pass filter may compensate for the low pass filter effect of the interconnect. The high pass filter includes a parallel resistor-capacitor (RC) circuit located in series along the transmission line (e.g., at the signal source or within the transmission line). The interconnect also includes a termination circuit at the receiver.

In contrast with active compensation circuits that use op-amps and analog (e.g., transistor) elements for pre-emphasis and equalization, the disclosed interconnect technique only uses low-power linear elements (e.g., resistors, capacitors, and inductors). Nevertheless, signaling rates up to substantially 50 Gbps can still be achieved with good jitter and eye-pattern characteristics. Furthermore, by including the high pass filter and termination circuit inside chip packaging, the resulting circuit may have a relatively low parasitic effect.

Figure 1:
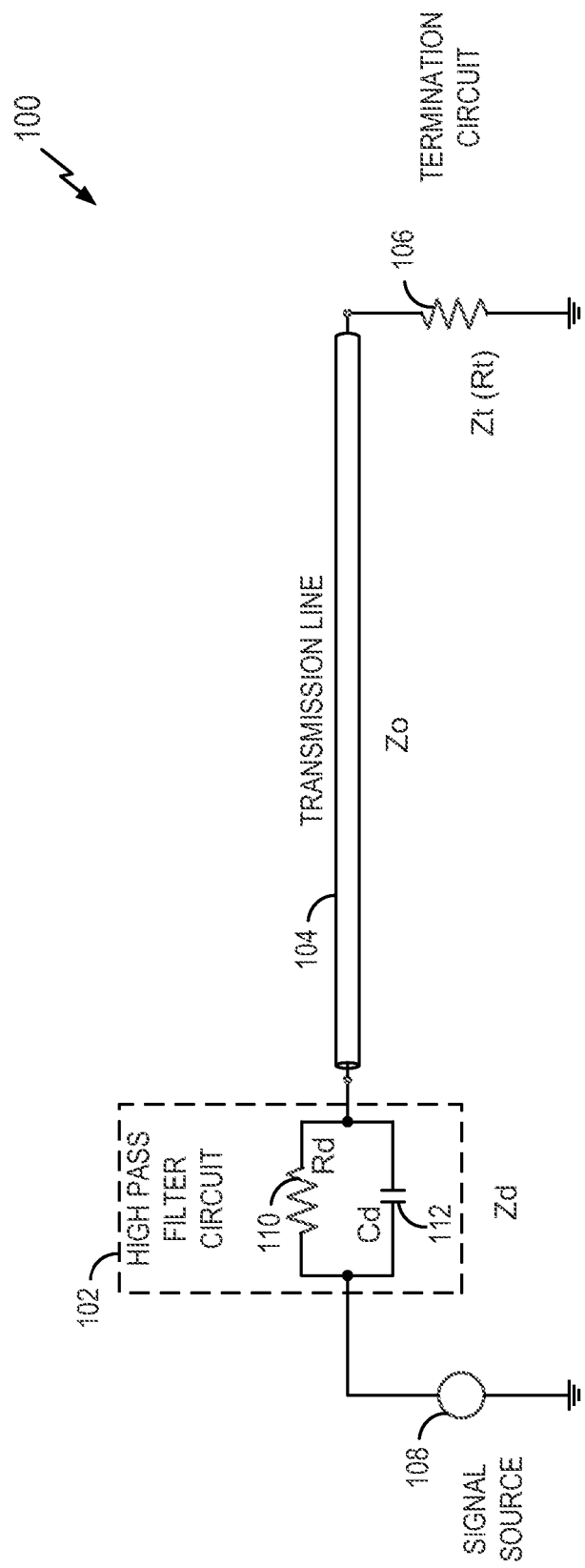
FIG. 1 is a circuit diagram illustrating an example of a signal interconnect in accordance with some aspects of the disclosure.
Figure 2:
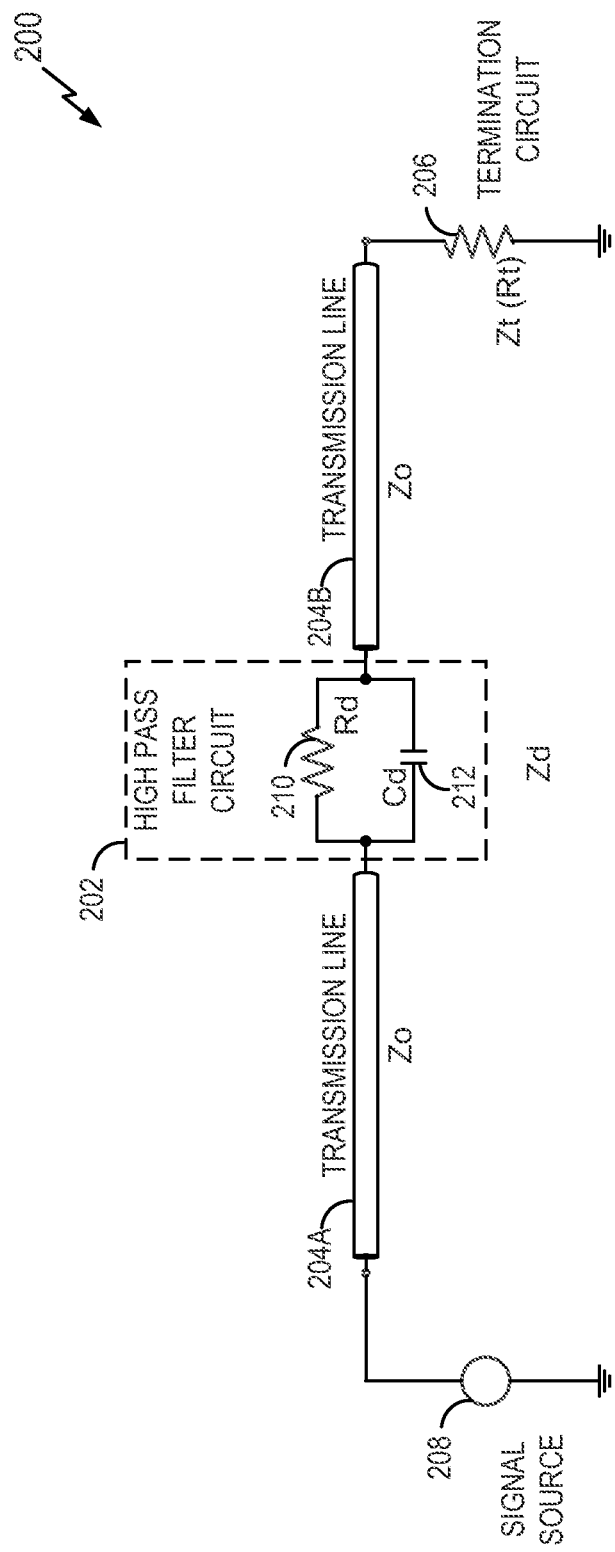
FIG. 2 is a circuit diagram illustrating another example of a signal interconnect in accordance with some aspects of the disclosure.
Figure 6:
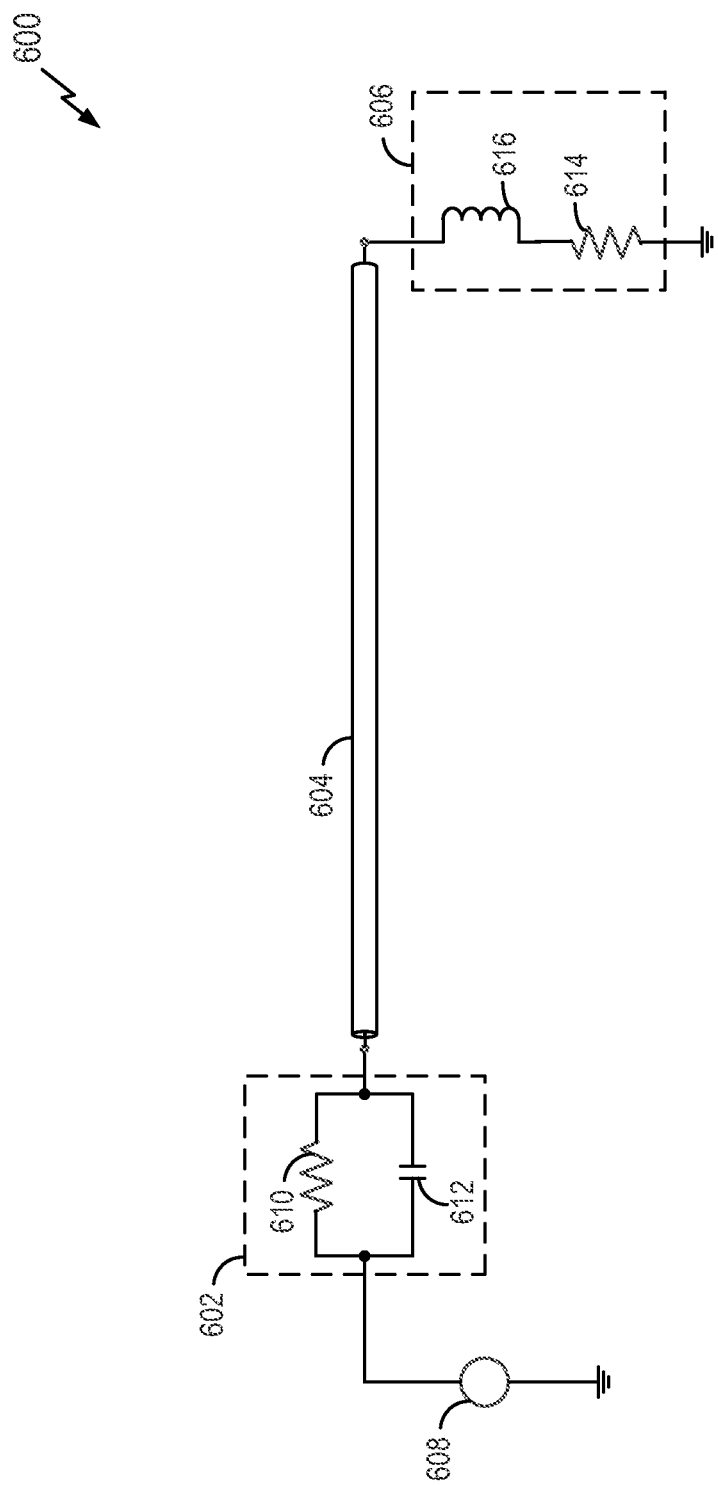
FIG. 6 is a circuit diagram illustrating another example of a signal interconnect in accordance with some aspects of the disclosure.
Figure 7:
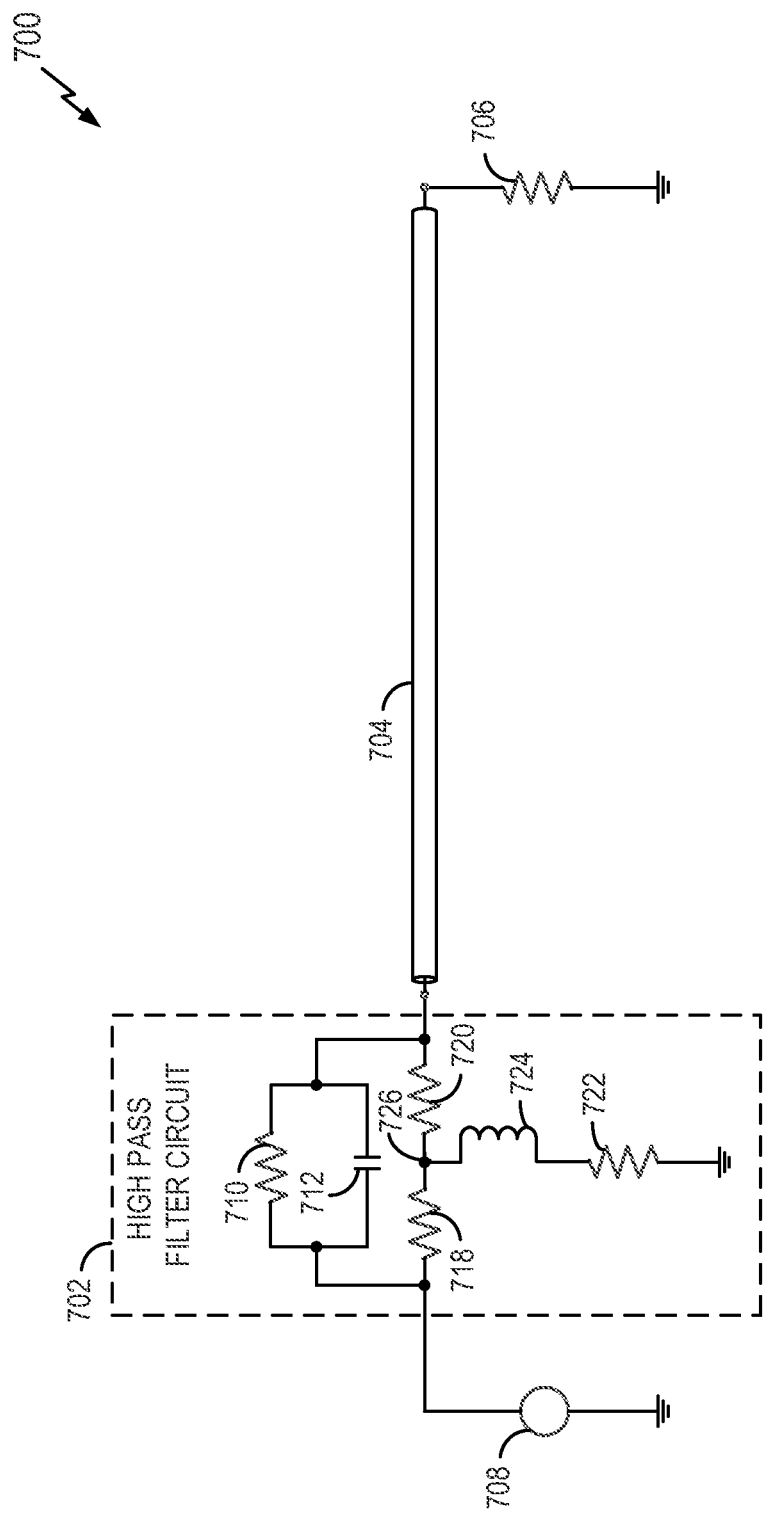
FIG. 7 is a circuit diagram illustrating another example of a signal interconnect in accordance with some aspects of the disclosure.
Figure 8:
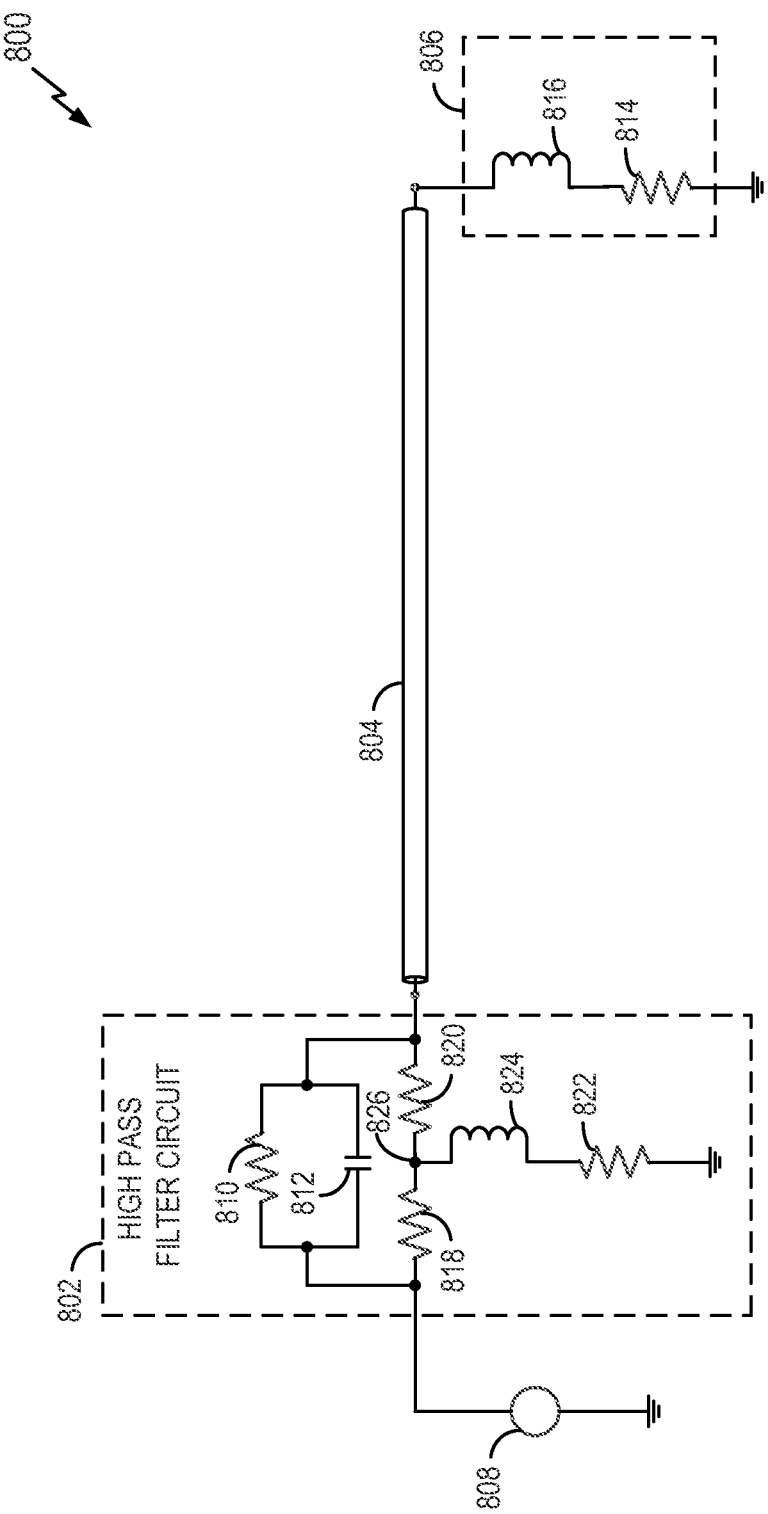
FIG. 8 is a circuit diagram illustrating another example of a signal interconnect in accordance with some aspects of the disclosure.

FIGS. 1 and 2 illustrate two examples of such an interconnect. The interconnect includes a series impedance Zd at the driver (FIG. 1) or elsewhere along the transmission line (FIG. 2) and a terminator Zt (Rt in these two examples) at the receiver. Other examples of the impedance Zd and the terminator Zt are shown in FIGS. 6-8.

In FIG. 1, a signal interconnect 100 includes a high pass filter circuit 102, a transmission line 104, and a termination circuit 106. A signal source 108 (e.g., a voltage source) drives a signal into the signal interconnect 100. The high pass filter circuit 102 includes a resistive circuit 110 (e.g., a resistor) and a capacitive circuit 112 (e.g., a capacitor) coupled in parallel. The impedance of the high pass filter circuit 102 is represented by Zd. The characteristic impedance of the transmission line 104 is represented by Zo. The impedance of the termination circuit 106 is represented by Zt.

In FIG. 2, a signal interconnect 200 includes a high pass filter circuit 202, transmission line segments 204A and 204B, and a termination circuit 206. A signal source 208 (e.g., a voltage source) drives a signal into the signal interconnect 200. The high pass filter circuit 202 includes a resistive circuit 210 (e.g., a resistor) and a capacitive circuit 212 (e.g., a capacitor) coupled in parallel. In this example, the high pass filter circuit 202 is located within the transmission line (i.e., within the transmission line segments 204A and 204B). The impedance of the high pass filter circuit 202 is represented by Zd. The characteristic impedance of the transmission line (transmission line segments 204A and 204B) is represented by Zo. The impedance of the termination circuit 206 is represented by Zt.

In an example implementation, the components of the signal interconnect 100 or 200 have the values that follow. Zt corresponds to a terminator resistance Rt since the termination circuit is simply a resistive circuit (e.g., a resistor) in the examples of FIGS. 1 and 2. The terminator resistance Rt matches the characteristic impedance of the transmission line, e.g., Rt=Zo. The series impedance Zd is composed of a resistor Rd in parallel with a capacitor Cd. The capacitor Cd functions as a short-cut for high frequency signals and as open for low frequency signals.

The resistor Rd is set to match the difference of the wire resistance between high frequency and low frequency conditions as set forth in the following Equation: Rd=Rw(f=1/T)−Rw(f→0). Here, Rw(f) is the wire resistance as a function of frequency f, and T is the time period of each bit. It is assumed that the dominant frequency is at f=½T at the given bit rate 1/T.

The capacitance of the capacitor Cd is selected to improve the quality of the eye diagram. The capacitance Cd affects the overall transfer function $T_{01} \times S_{12}$, where $T_{01}$ is the transfer function of the serial impedance Zd between the input voltage source and the input part of the transmission line, and $S_{12}$ is the transfer function of the transmission line.

Digital signals have wide band frequency components. By employing a fixed transfer rate in a wide band frequency, all frequency components can contribute a similar output. Cd can thus be determined by manipulation of the following equations assuming a fixed value for $T_{01}$ (e.g., an optimum value of 0.5): $T_{01}(s)=Zt/(Zd+Zt)$, where $Zd=1/(1/Rd+sCd)$. Here, Zt (for Rt in FIG. 1), Zd, and Rd are known for a given operating frequency and $T_{01}$ is assumed (e.g., 0.5).

With the above in mind, additional details of a signal interconnect in accordance with the teachings herein will be discussed with reference to FIGS. 3-5. For purposes of illustration, this discussion may refer to the signal interconnect 100 of FIG. 1. It should be appreciated that these discussions may be equally applicable to other signal interconnect implementations.

Transmission Lines

Transmission-lines are a special class of the more general electro-magnetic waveguide. The voltage and current on the transmission line appear in the form of wave propagation which is a function of both propagation distance z and time t. Assuming the per-unit-length series resistance, series inductance, shunt conductance, and shunt capacitance are R, L, G, and C, respectively, the voltage and current on the transmission line are dictated by the telegrapher's equations:

$$\frac{\partial V(z,t)}{\partial z} = -RI(z,t) - L\frac{\partial I(z,t)}{\partial t} \quad (1)$$

$$\frac{\partial V(z,t)}{\partial z} = -GV(z,t) - C\frac{\partial V(z,t)}{\partial t} \quad (2)$$

The general solution to the above telegrapher's equations can be expressed as:

$$V(z)=V^+(z)+V^-(z)=V_0^+(z)e^{\gamma z}+V_0^-(z)e^{\gamma z} \quad (3)$$

where $V^+(z)$ and $V^-(z)$ are the waves traveling in the z+ direction and the z− direction, respectively, with propagation constant γ:

$$\gamma=\alpha+j\beta=\sqrt{(R+j\omega L)(G+j\omega C)} \quad (4)$$

where α and β correspond to attenuation and phase velocity, and are functions of frequency in general.

Depending on the R, L, G, and C values and frequency, the transmission line can operate in the RC region, the LC region, or the skin effect region. When an ideal digital pulse train is transmitted over the channel this frequency dependency of attenuation and phase velocity will result in distortion of the waveform, causing inter-symbol interference (ISI). One can obtain frequency-independent attenuation and phase velocity across the whole spectrum. Equation (4) is reduced to:

$$\gamma = \sqrt{(R+j\omega L)(G+j\omega C)} = \frac{R}{Z_0} + j\omega\sqrt{LC} \quad (5)$$

$$Z_0 = \sqrt{\frac{L}{C}} \quad (6)$$

For inter-chip applications, R, L, G, and C are frequency dependent because of the skin effect and the proximity effect. These frequency dependent parameters may make transmission-line analysis relatively difficult in inter-chip communication in which the input signal may range from very low frequency to high frequency.

Scattering Parameters Evaluation

A digital signal has wide band frequency components which also may make inter-chip communication analysis relatively difficult. However, by identifying a fixed transfer rate in the wide band frequency, all frequency components can contribute a similar output. Thus, a relatively perfect eye diagram may be achieved. In accordance with the teachings herein, a high pass filter is used to compensate the low pass characteristics of a lossy inter-chip interconnect. As discussed above in conjunction with FIG. 1, the interconnect may includes a serial impedance $Z_d$ at the driver and a terminator $R_t$ at the receiver. The signal may be driven by a voltage source at the driver. The terminator resistance matches the characteristic impedance of the transmission line, i.e., $R_t=Z_0$. The serial impedance $Z_d$ is composed of a resistor $R_d$ in parallel with a capacitor $C_d$. The capacitor $C_d$ functions as a short-cut for high frequency signals and as an open for low frequency signals. The resistor $R_d$ is set to match the difference of the wire resistance between high frequency and low frequency conditions as discussed above:

$$Rd=Rw(f=1/T)-Rw(f\rightarrow 0) \quad (7)$$

In some aspects, compensation is only made for skin effect because the loss tangent value is usually a small value in inter-chip communication. A small loss tangent value leads to small G and C, such that the resistor value dominates in equation (4). The capacitor $C_d$ is fine tuned to improve the quality of the eye diagram. The capacitance $C_d$ has effects on the overall transfer function $T_{01} \times S_{12}$, where $T_{01}$ is the transfer function of the serial impedance $Z_d$ between the input voltage source and the input part of the transmission line, and $S_{12}$ is the transfer function of the transmission line. The transfer function $T_{01}$ in the s domain can be expressed as discussed above:

$$T_{01}(s)=Zt/(Zd+Zt) \quad (8)$$

where $$Zd=1/(1/Rd+sCd) \quad (9)$$

$Z_i$ is the input impedance of the transmission line. When the transmission line is terminated with the matched resistance $Z_t$, to simplify the derivation, one can assume that the input impedance at the input port of the transmission line is equal to the characteristic impedance, i.e., $Z_i=Z_0$.

Figure 3:
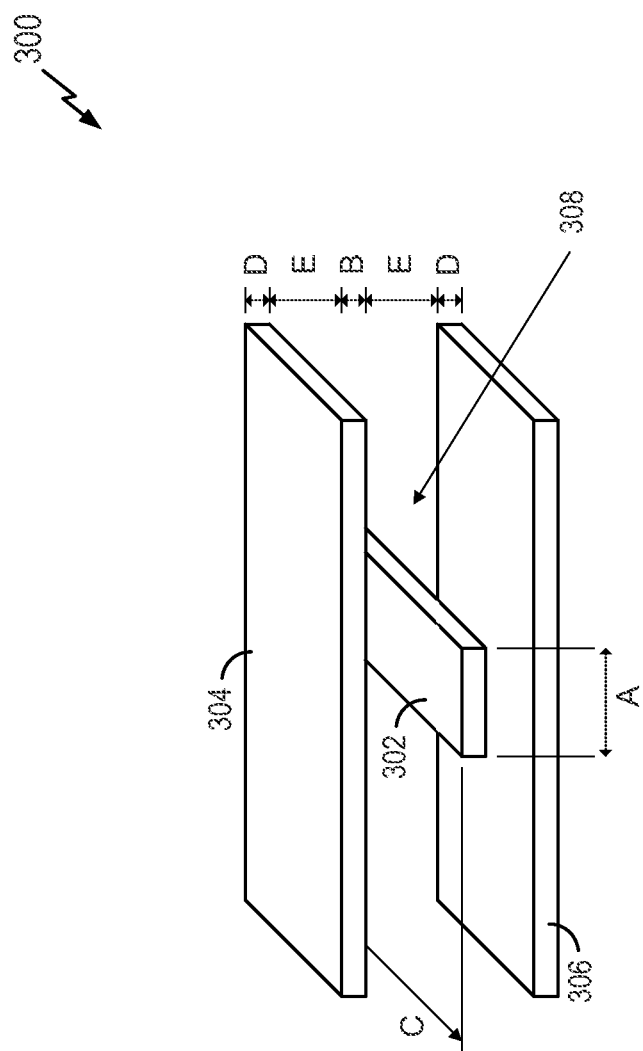
FIG. 3 is a diagram illustrating an example of a stripline trace in accordance with some aspects of the disclosure.

FIG. 3 illustrates an example transmission line 300 implemented using thin film technology. The illustrated stripline trace 302 has a width A (e.g., 4.5 μm or some other suitable width), a thickness B (e.g., 4.5 μm or some other suitable thickness), and a length C (e.g., 10 cm or some other suitable length). The trace 302 is embedded between two metal layers 304 and 306, with a liquid crystal polymer dielectric material 308 disposed between the metal layers 304 and 306. In an example implementation, the dielectric material 308 has the characteristics $\xi_y=3.0$ and tan θ=0.0025. In an example implementation, each of the metal layers 304 and 306 has a thickness D (e.g., 4.5 μm or some other suitable thickness), and a spacing E (e.g., 20 μm or some other suitable spacing) from the stripline trace 302.

Continuing with the above example, the transmission line may have characteristic impedance $Z_0=74\Omega$, wire resistance $R_w(f\approx 0)=50\Omega$, and $R_w(f\approx 5\text{ G})=114\Omega$. The serial resistor $R_d=(114-50)=64\Omega$ to balance the total resistor values between the high frequency path and the low frequency path. The terminator matches the impedance of the line. The capacitor is tuned at $C_d=9\times 10^{-13}$ F.

In this example, the transfer function $T_{01}$ rises with frequency while $S_{12}$ drops, and the overall effect is a flatter curve. A flatter curve from low frequency to high frequency means that a similar $S_{12}$ (transfer function) can be used in a wide frequency range. Thus, the disclosed scheme can have similar bandwidth performance from low frequency to high frequency. This characteristic helps to reduce jitter effectively when the input signal has a wide frequency range.

Comparison with Other Schemes

For a comparison with other two schemes, eye heights and jitters are measured at bit rates ranging from 10 Gbps to 50 Gbps. The two comparison cases are a transmission line with a terminator only ($R_t$) and a transmission line with the disclosed serial impedance scheme with terminator ($Z_d$). The serial impedance is set according to the operating bit rate. Table 1 lists the impedance values and the wire resistance Rw(f) with f=1/T. The wire resistance is included for reference. In this example, $R_w(f\approx0)=50\Omega$. The capacitance $C_d$ is tuned at an increment of 0.01 pF.

TABLE 1

Impedance according to the operating bit rate.

| Bit Rate | Rw, (f = ½ T) | Rd, | Cd, pF |
|---|---|---|---|
| 10 Gbps | 114 Ω | 64 Ω | 0.90 |
| 20 Gbps | 159 Ω | 109 Ω | 0.52 |
| 30 Gbps | 191 Ω | 141 Ω | 0.41 |
| 40 Gbps | 218 Ω | 168 Ω | 0.31 |
| 50 Gbps | 243 Ω | 193 Ω | 0.30 |

Table 2 sets forth an example of power consumption and eye diagram at the bit rates from 10 Gbps to 50 Gbps. The case of a transmission line without a terminator is also included for reference.

serial impedance but no termination ($Z_d$+open). For the transmission line without termination, the eye height is 0.22 V but the jitter is 66.5 ps. For the case $Z_d$+open, the reflection at the receiver impedance increases the eye height to 0.62 V. The serial impedance is able to keep the jitter down to 7.45 ps. The Energy/$E_h^2$ is 0.98 which is the lowest among the four cases.

For the transmission line with a terminator only ($R_t$), the communication consumes power at the range of 5.69-6.49 mW. In terms of power/bandwidth, the numbers drop from 0.57 joule/bit at 10 Gbps to 0.16 at 40 Gbps. Factorized by the eye height, the power/(bandwidth/$E_h^2$) actually increases from 2.1 pjoule=(bit×$V^2$) at 10 Gbps to 32.6 at 40 Gbps. For the disclosed serial impedance scheme ($Z_d$), the power decreases from 3.84 mW at 10 Gbps to 2.3 mW at 50 Gbps because the serial impedance increases with bandwidth (Table 1). The power/bandwidth reduces from 0.38 pjoule/bit at 10 Gbps to 0.046 pjoule/bit at 50 Gbps. After normalizing by the eye height, the power=(bandwidth/$E_h^2$) becomes 2.78 pjoule/(bit×$V^2$) at 10 Gbps and 1.04 at 50 Gbps. The eye height is 0.37 V at 10 Gbps and 0.21 at 50 Gbps. The jitter stays within 2.1 ps up to 50 Gbps.

As another example, for the serial impedance scheme, the eye height is 0.249 V and jitter is 2.1 ps. For the line with terminator only, the eye height is 0.07 and jitter is 15.6 ps which is 62.4% of a bit interval T=25 ps. For the line with shunt resistors only, the eye height and jitter are not distinguishable (ND). For the line with shunt and terminator resistors, the eye is 0.06 and jitter is 13.8 ps.

Power consumption and energy per bit comparisons are set forth in Table 3 and Table 4 for the cases of a transmission line without termination (naked T-line), a transmission line with a termination resistor (Rt-only), a transmission line with a shunt resistor (A), a transmission line with a driven

TABLE 2

Power consumption and eye diagram from 10 Gbps to 50 Gbps

| | T-line (10 G) | | | T-line (20 G) | | T-line (30 G) | | T-line (40 G) | | T-line (50 G) | |
|---|---|---|---|---|---|---|---|---|---|---|---|
| Case | Naked | Zd + open | Rt | Zd | Rt | Zd | Rt | Zd | Rt | Zd | Rt | Zd |
| Power (mW) | 4.2 | 3.8 | 5.69 | 3.84 | 6.29 | 2.9 | 5.79 | 2.5 | 6.49 | 2.2 | 6.46 | 2.3 |
| Power/BW. (pjoule/bit) | 0.42 | 0.38 | 0.57 | 0.38 | 0.32 | 0.14 | 0.19 | 0.083 | 0.16 | 0.055 | 0.13 | 0.046 |
| Energy/$E_h^2$. (pjoule/$V^2$bit) | 8.67 | 0.98 | 2.1 | 2.78 | 2.93 | 1.21 | 5.26 | 0.92 | 32.6 | 1.03 | ND | 1.04 |
| $E_h$ (V) | 0.22 | 0.62 | 0.52 | 0.37 | 0.33 | 0.34 | 0.19 | 0.30 | 0.07 | 0.23 | ND | 0.21 |
| Jitter (ps) | 66.5 | 7.45 | 7.44 | 0.58 | 10.3 | 0.99 | 13.78 | 1.83 | 15.6 | 2.1 | ND | 1.93 |

The first three rows of Table 2 describe the power, power/bandwidth, and the normalized power/bandwidth by the eye height, i.e., power=(bandwidth/$E_h^2$). The last two rows depicts the eye height and jitter. For all three cases, eye heights drop and jitters rise as frequency increases. For the case with a terminator ($R_t$), the eye height has 0.52 V at 10 Gbps but drops to 0.07 V at 40 Gbps and becomes not distinguishable (ND) at 50 Gbps. For the case with serial impedance ($Z_d$), the eye height has 0.37 V at 10 Gbps, however the jitter is only 0.582 ps. Moreover, the jitter remains reasonably small as the bit rate increases. At 50 Gbps, the serial impedance scheme has jitter 1.93 ps. Therefore, one can still observe a 0.21 V eye height. At bandwidth 10 G, two more cases are included: a transmission line without termination (naked) and a transmission line with resistor and a termination resistor (B), a transmission line according to the disclosed scheme (Zd), and a transmission line with pre-emphasis and equalization (C). The optimal results are achieved by gradually tuning resistor and capacitor parameters values. As indicated, the disclosed scheme has the smallest jitter, and the largest eye-height with less power consumption which is the best case in all comparison cases. Power consumption is evaluated by output voltage times output current. Compared with pre-emphasis and equalization schemes, the disclosed scheme has a smaller eye height but better jitter and power consumption at both 10 Gbps and 50 Gbps. Also, other passive compensation methods generally cannot tolerate up to 50 Gbps. At 50 Gbps, although the disclosed scheme has smaller $E_h$/Jitter (0.20 vs. 0.29) than equalization, power may be reduced by up to 11.8× (3.84 vs. 38.7).

TABLE 3

Power consumption and energy per bit comparison (10 Gbps)

| Case | Naked T-line | T-line with | | | | |
|---|---|---|---|---|---|---|
| | | Rt-only | A | B | Zd | C |
| Jitter (ps) | 66.5 | 7.44 | 18.1 | 4.2 | 0.58 | 2.1 |
| $E_h$ (V) | 0.22 | 0.52 | 0.53 | 0.54 | 0.37 | 0.8 |
| Power (mW) | 4.2 | 5.69 | 6.28 | 6.3 | 3.84 | 38.7 |
| $E_h$/Jitter (V/ps) | 0.003 | 0.06 | 0.03 | 0.126 | 0.637 | 0.38 |

TABLE 4

Power consumption and energy per bit comparison (50 Gbps)

| Case | Naked T-line | T-line with | | | | |
|---|---|---|---|---|---|---|
| | | Rt-only | A | B | Zd | C |
| Jitter (ps) | ND | ND | ND | ND | 1.04 | 2.7 |
| $E_h$ (V) | ND | ND | ND | ND | 0.21 | 0.8 |
| Power (mW) | 4.7 | 6.46 | 6.83 | 6.7 | 3.84 | 45.6 |
| $E_h$/Jitter (V/ps) | ND | ND | ND | ND | 0.20 | 0.29 |

Figure 4:
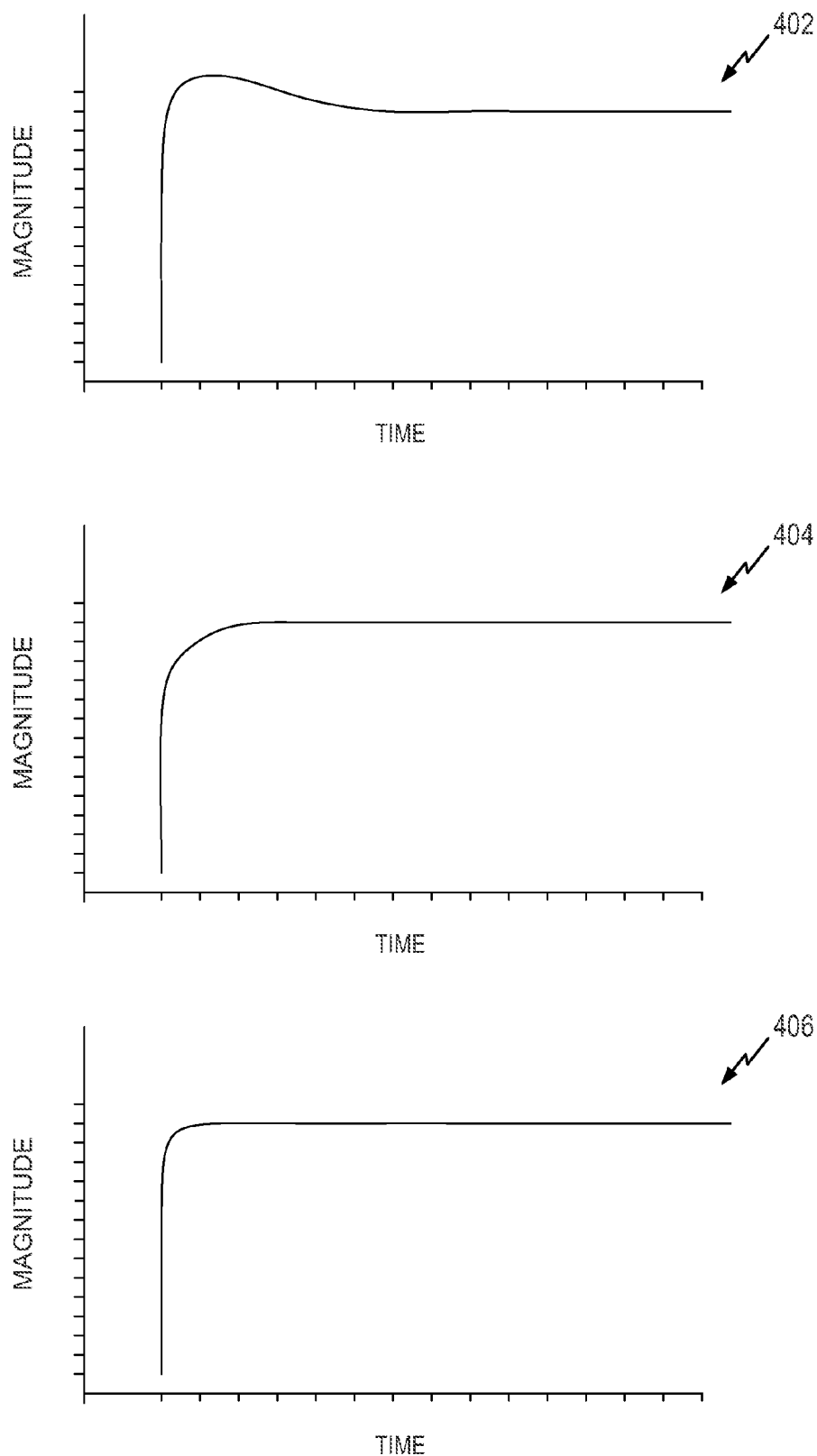
FIG. 4 illustrates several examples of response curves in accordance with some aspects of the disclosure.

FIG. 4 illustrates simplified examples of signal response characteristics for three of the above comparison scenarios. A first graph 402 illustrates an example response for a transmission line with a termination resistor. A second graph 404 illustrates an example response for a transmission line with a driven resistor and a termination resistor. A third graph 406 illustrates an example response for the disclosed scheme. As indicated, the disclosed scheme provides a more linear response.

In view of the above, the disclosed compensation scheme may achieve a bandwidth of 50 Gbps without pre-emphasis and equalization. Moreover, these high data rates can be achieved with relatively low power (low joule/bit), a relatively large eye value, and a relatively low jitter value.

In some aspects, the disclosed scheme is based on an analytical $S_{12}$ Parameter assumption and bitonic assumption to provide optimal termination and driven impedance that reduces jitter minimization and increases the eye opening. For example, jitter and eye prediction methods can be derived using bitonic assumption with less than 6% error rate. At 50 Gbps, even though smaller $E_h$/Jitter (0.20 vs. 0.29) is achieved as compared to other equalization schemes, power consumption may still be less than in those other schemes. As discussed above, jitter may be below 2.5 ps and eye height above 0.21 V up to a bandwidth of 50 Gbps. Also as discussed above, power consumption may be on the order of 0.046 pjoule/bit at 50 Gbps. A reduction in power consumption of up to 2.8× or 30× may thus be achieved as compared to terminator resistor-only schemes for 50 Gbps or 40 Gbps scenarios, respectively. Also reduction in power consumption of up to 11.8× (3.84 vs. 38.7) may be achieved as compared to other equalization schemes.

At 10 Gbps, this scheme may reduce jitter up to 31×, 12.8× and 7.2× as compared to techniques that use a shunt resistor, a terminator resistor, and combinations thereof. Also, power consumption may be reduced up to 11.8× (3.84 vs. 38.7) as compared with conventional equalization schemes. Thus, with a 50 Gbps high speed I/O and pipeline interleaved data access, data rates up to 50 Gbps may be achieved (e.g., in a fast write/read SRAM).

Example Implementation

Figure 5:
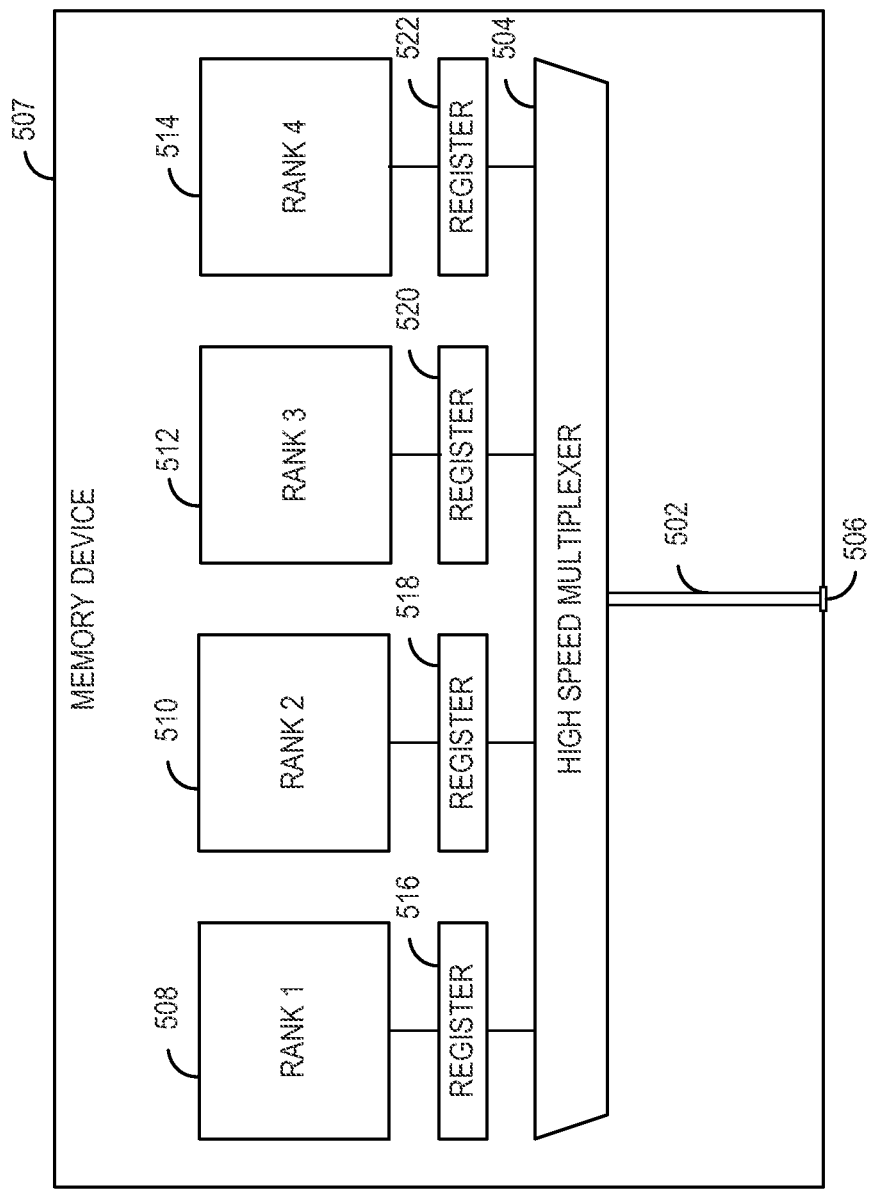
FIG. 5 is a block diagram illustrating an example of a memory device that includes a high speed signal interconnect in accordance with some aspects of the disclosure.

FIG. 5 illustrates an example implementation for a signal interconnect 502 as taught herein. The signal interconnect 502 couples high speed signals (e.g., 50 Gbps) from a high speed multiplexer 504 to a terminal 506 for off-chip communication. In this example, the chip (e.g., integrated circuit) is a memory device 507 that include four memory ranks 508, 510, 512 and 514. Reads and writes to and from each of the individual ranks are stored in a corresponding one of the registers 516, 518, 520, or 522 for sequential transfer to/from the multiplexer 504. Thus, a high speed data rate (e.g., 50 Gbps) may be employed for memory components (e.g., the memory ranks 508, 510, 512 and 514) that each operate at a lower speed (e.g., 12.5 Gbps).

Other Implementations

The series impedances, terminator impedances, and the transmission lines discussed above may take different forms in different implementations. FIGS. 6-9 describe three different implementations.

In FIG. 6, a signal interconnect 600 includes a high pass filter circuit 602, a transmission line 604, and a termination circuit 606. A signal source 608 (e.g., a voltage source) drives a signal into the signal interconnect 600. The high pass filter circuit 602 includes a resistive circuit 610 (e.g., a resistor) and a capacitive circuit 612 (e.g., a capacitor) coupled in parallel. In this implementation, the termination circuit 606 includes a resistive circuit 614 (e.g., a resistor) and an inductive circuit 616 (e.g., an inductor) coupled in series.

In FIG. 7, a signal interconnect 700 includes a high pass filter circuit 702, a transmission line 704, and a termination circuit 706. A signal source 708 (e.g., a voltage source) drives a signal into the signal interconnect 700. The high pass filter circuit 702 includes a resistive circuit 710 (e.g., a resistor) and a capacitive circuit 712 (e.g., a capacitor) coupled in parallel. In this implementation, the high pass filter circuit 702 also includes resistive circuits 718 and 720 (e.g., resistors) in series with the transmission line 704 and in parallel with the resistive circuit 710 and the capacitive circuit 712. In addition, a resistive circuit 722 (e.g., a resistor) and an inductive circuit 724 (e.g., an inductor) are coupled in series between ground and an interconnect point 726 for the resistive circuits 718 and 720.

In FIG. 8, a signal interconnect 800 includes a high pass filter circuit 802, a transmission line 804, and a termination circuit 806. A signal source 808 (e.g., a voltage source) drives a signal into the signal interconnect 800. The high pass filter circuit 802 includes a resistive circuit 810 (e.g., a resistor) and a capacitive circuit 812 (e.g., a capacitor) coupled in parallel. In this implementation, the termination circuit 806 includes a resistive circuit 814 (e.g., a resistor) and an inductive circuit 816 (e.g., an inductor) coupled in series as in FIG. 6.

In addition, the high pass filter circuit 802 also includes resistive circuits 818 and 820 (e.g., resistors) in series with the transmission line 804 and in parallel with the resistive circuit 810 and the capacitive circuit 812 as in FIG. 7. Also, a resistive circuit 822 (e.g., a resistor) and an inductive circuit 824 (e.g., an inductor) are coupled in series between ground and an interconnect point 826 for the resistive circuits 818 and 820 as in FIG. 7.

Figure 9:
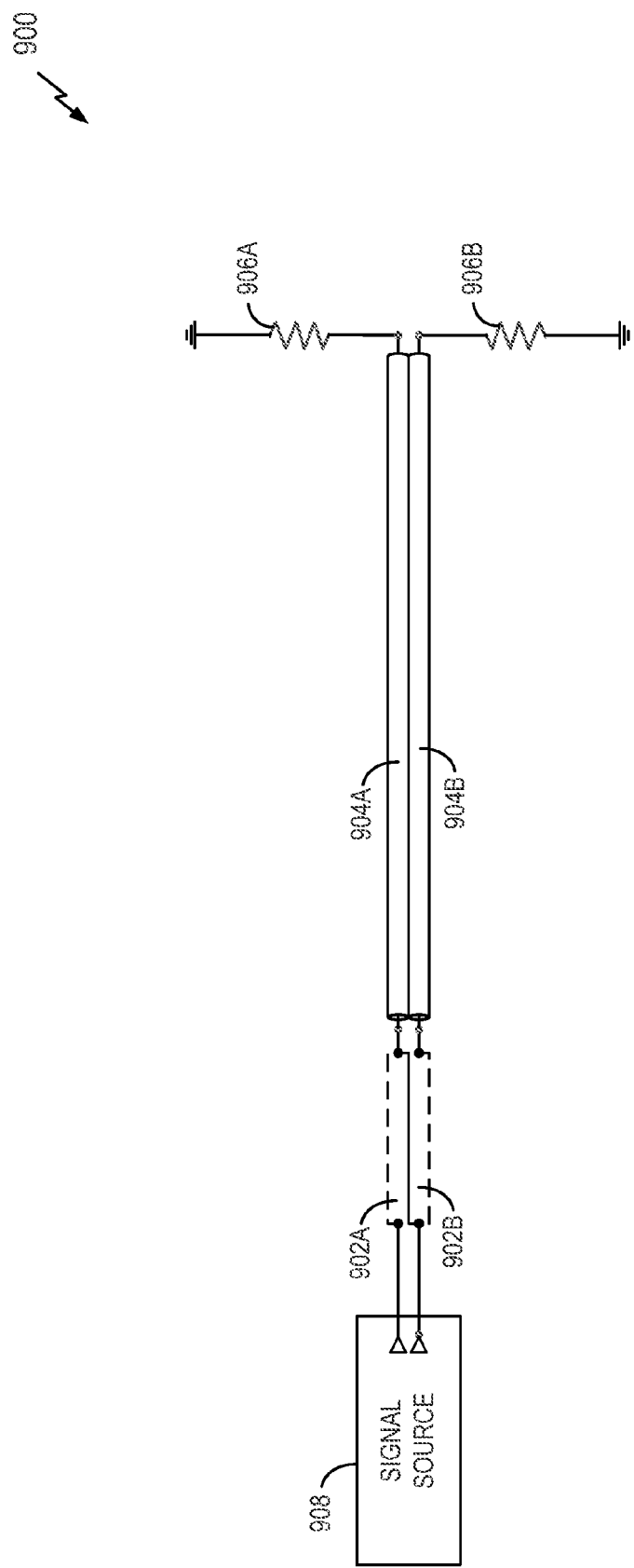
FIG. 9 is a circuit diagram illustrating another example of a signal interconnect in accordance with some aspects of the disclosure.

FIG. 9 illustrates that a signal interconnect as taught herein may be employed in a transmission line that includes more than one conductor. In the example of FIG. 9, the transmission line includes two conductors. Some other number of conductors could be used in other implementations.

In FIG. 9, a signal interconnect 900 includes respective high pass filter circuits 902A and 902B for each conductor of the transmission line, a transmission line with a first conductor 904A and a second conductor 904B, and termination circuits 906A and 906B for each conductor. A signal source 908 (e.g., a voltage source) drives a signal into the signal interconnect 900. The high pass filter circuit 902 (high pass filter circuits 902A and 902B) includes passive components as taught herein.

Example Process

Figure 10:
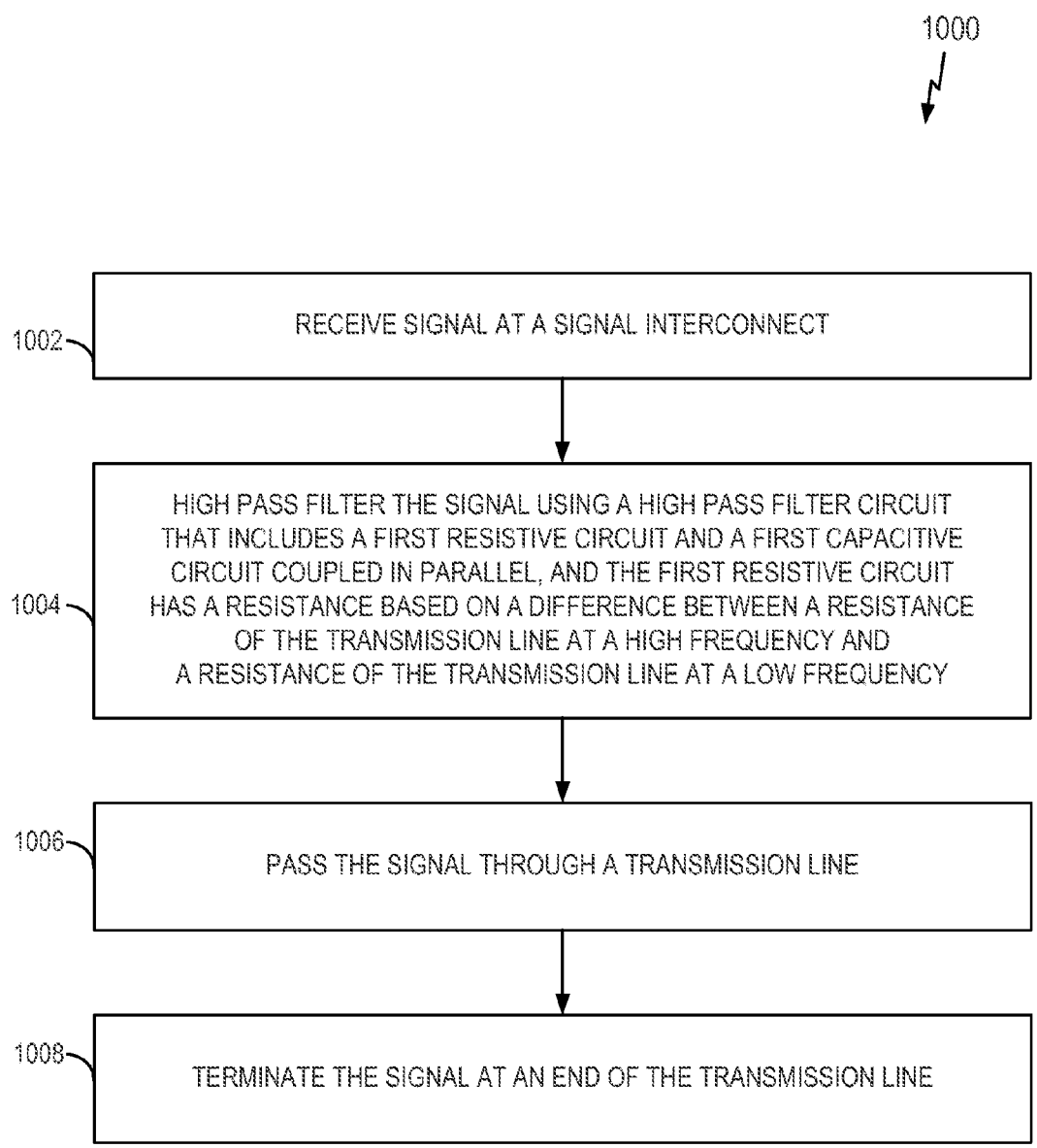
FIG. 10 is a flowchart illustrating an example of a signal interconnect process in accordance with some aspects of the disclosure.

FIG. 10 illustrates an example process for signal compensation in accordance with the teachings herein.

At block 1002, a signal is received at a signal interconnect.

At block 1004, the signal is high pass filtered. In accordance with the teachings herein, the high pass filter circuit includes a first resistive circuit and a first capacitive circuit coupled in parallel. The first resistive circuit has a resistance based on a difference between a resistance of the transmission line at a high frequency and a resistance of the transmission line at a low frequency.

At block 1006, the signal passes through a transmission line.

At block 1008, the signal is terminated at an end of the transmission line.

Additional Aspects

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of example processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein. Additional elements, components, steps, and/or functions may also be added or not utilized without departing from the disclosure.

While features of the disclosure may have been discussed relative to certain implementations and figures, all implementations of the disclosure can include one or more of the advantageous features discussed herein. In other words, while one or more implementations may have been discussed as having certain advantageous features, one or more of such features may also be used in accordance with any of the various implementations discussed herein. In similar fashion, while example implementations may have been discussed herein as device, system, or method implementations, it should be understood that such example implementations can be implemented in various devices, systems, and methods.

Also, it is noted that at least some implementations have been described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. In some aspects, a process may correspond to a method, a function, a procedure, a subroutine, a subprogram, etc. When a process corresponds to a function, its termination corresponds to a return of the function to the calling function or the main function. One or more of the various methods described herein may be partially or fully implemented by programming (e.g., instructions and/or data) that may be stored in a machine-readable, computer-readable, and/or processor-readable storage medium, and executed by one or more processors, machines and/or devices.

Those of skill in the art would further appreciate that the various illustrative logical blocks, modules, circuits, and algorithm steps described in connection with the implementations disclosed herein may be implemented as hardware, software, firmware, middleware, microcode, or any combination thereof. To clearly illustrate this interchangeability, various illustrative components, blocks, modules, circuits, and steps have been described above generally in terms of their functionality. Whether such functionality is implemented as hardware or software depends upon the particular application and design constraints imposed on the overall system.

Within the disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the disclosure, without limitation as to the type of electronic circuits, as well as software implementations of information and instructions that, when executed by a processor, enable the performance of the functions described in the disclosure.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

Accordingly, the various features associated with the examples described herein and shown in the accompanying drawings can be implemented in different examples and implementations without departing from the scope of the disclosure. Therefore, although certain specific constructions and arrangements have been described and shown in the accompanying drawings, such implementations are merely illustrative and not restrictive of the scope of the disclosure, since various other additions and modifications to, and deletions from, the described implementations will be apparent to one of ordinary skill in the art. Thus, the scope of the disclosure is only determined by the literal language, and legal equivalents, of the claims which follow.

What is claimed is:

1. A signal interconnect comprising:
   a transmission line;
   a termination circuit coupled to the transmission line; and
   a high pass filter circuit coupled in series along the transmission line, wherein the high pass filter circuit includes a first resistive circuit and a first capacitive circuit coupled in parallel, and the first resistive circuit has a resistance based on a difference between a resistance of the transmission line at a high frequency and a resistance of the transmission line at a low frequency.

2. The signal interconnect of claim 1, wherein the first capacitive circuit has a capacitance selected based on at least one of a desired transfer function value, an operating frequency, a characteristic impedance of the transmission line, and the resistance of the first resistive circuit.

3. The signal interconnect of claim 2, wherein the desired transfer function value is substantially equal to 0.5.

4. The signal interconnect of claim 1, wherein the resistance of the first resistive circuit is equal to $Rw(f=1/T)-Rw(f\rightarrow 0)$, where $Rw(f)$ is wire resistance as a function of a frequency f, and T is a time period of a bit carried by the transmission line.

5. The signal interconnect of claim 1, wherein the capacitance of the first capacitive circuit is based on $T(s)=Zt/(Zd+Zt)$, where $Zd=1/(1/Rd+sCd)$, and where $T(s)$ is a transfer function, Zt is an impedance of the termination circuit, Zd is an impedance of the high pass filter circuit, Rd is the resistance of the first resistive circuit, s is a function of a frequency of a signal, and Cd is the capacitance of the first capacitive circuit.

6. The signal interconnect of claim 1, wherein an impedance of the termination circuit is substantially equal to a characteristic impedance of the transmission line.

7. The signal interconnect of claim 1, further comprising a signal source, wherein the high pass filter circuit is located between the signal source and the transmission line.

8. The signal interconnect of claim 1, wherein the transmission line includes the high pass filter circuit.

9. The signal interconnect of claim 1, wherein the high pass filter circuit further comprises a second resistive circuit in parallel with the first resistive circuit and the first capacitive circuit.

10. The signal interconnect of claim 9, wherein:
    the second resistive circuit comprises a third resistive circuit in series with a fourth resistive circuit;
    the third resistive circuit is coupled to the fourth resistive circuit at a connection point; and
    the signal interconnect further comprises another high pass filter circuit coupled between the connection point and a ground terminal.

11. The signal interconnect of claim 10, wherein the another high pass filter circuit comprises an inductive circuit in series with a fifth resistive circuit.

12. The signal interconnect of claim 1, wherein the termination circuit comprises a second resistive circuit.

13. The signal interconnect of claim 1, wherein the termination circuit comprises an inductive circuit in series with a second resistive circuit.

14. The signal interconnect of claim 1, wherein the transmission line further comprises a differential pair of conductors.

15. The signal interconnect of claim 1, wherein a capacitance of the first capacitive circuit is selected to improve a quality of an eye diagram associated with a signal carried by the signal interconnect.

16. The signal interconnect of claim 1, wherein a capacitance of the first capacitive circuit is selected to reduce jitter associated with a signal carried by the signal interconnect.

17. The signal interconnect of claim 1, wherein a capacitance of the first capacitive circuit is selected to compensate for a low pass effect of the transmission line.

* * * * *